(12) United States Patent
Yang

(10) Patent No.: US 8,929,150 B2
(45) Date of Patent: Jan. 6, 2015

(54) NONVOLATILE MEMORY APPARATUS CAPABLE OF DETERMINING AN APPLICATION TIME OF A PROGRAM VOLTAGE APPLIED TO A SELECTED WORD LINE

(75) Inventor: Chul Woo Yang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 132 days.

(21) Appl. No.: 13/604,442

(22) Filed: Sep. 5, 2012

(65) Prior Publication Data
US 2013/0201769 A1   Aug. 8, 2013

(30) Foreign Application Priority Data

Feb. 6, 2012 (KR) .................. 10-2012-0011813

(51) Int. Cl.
 *G11C 16/32* (2006.01)
(52) U.S. Cl.
 USPC ............ 365/185.23; 365/185.02; 365/185.19
(58) Field of Classification Search
 USPC ............. 365/185.02, 185.19, 185.23, 185.09
 See application file for complete search history.

(56) References Cited

U.S. PATENT DOCUMENTS 5,012,445 A * 4/1991 Kazuaki et al. .......... 365/189.06
7,675,780 B2   3/2010 Lee
8,559,260 B2 * 10/2013 Kwon ........................ 365/226

FOREIGN PATENT DOCUMENTS

KR       10-0706816 B1    4/2007
KR    10-2010-0014675 A   2/2010

* cited by examiner

*Primary Examiner* — Andrew Q Tran
(74) *Attorney, Agent, or Firm* — William Park & Associates Patent Ltd.

(57) ABSTRACT

A nonvolatile memory apparatus includes: a memory cell area including a plurality of memory cells connected to a word line and a bit line; a program time controller configured to determine a program voltage application time for a selected word line, as the selected word line is selected in response to a program command and an address signal; and a controller configured to apply a program voltage to the selected word line according to the program voltage application time determined by the program time controller.

8 Claims, 4 Drawing Sheets

| WL<k> | ak | Δt_k | ... |

NONVOLATILE MEMORY APPARATUS CAPABLE OF DETERMINING AN APPLICATION TIME OF A PROGRAM VOLTAGE APPLIED TO A SELECTED WORD LINE

CROSS-REFERENCES TO RELATED APPLICATION

The present application claims priority under 35 U.S.C. §119(a) to Korean application number 10-2012-0011813, filed on Feb. 6, 2012, in the Korean Intellectual Property Office, which is incorporated herein by reference in its entirety.

BACKGROUND

1. Technical Field

The present invention relates generally to a memory system, and more particularly, to a nonvolatile memory apparatus, a program method thereof, and a data processing system using the same.

2. Related Art

A nonvolatile memory apparatus represented by a flash memory apparatus is a memory apparatus capable of replacing a hard disc drive (HDD) which is an existing large-capacity storage device. The nonvolatile memory apparatus has small power consumption, is shock-resistant, and may be implemented with high capacity and high integration.

When a flash memory apparatus is programmed, a program voltage Vpgm is applied to a word line to be programmed, while a pass voltage Vpass is applied to a program inhibit word line.

More specifically, the program voltage Vpgm and the pass voltage Vpass, generated by a voltage provider, are applied to a global word line, and the voltages applied to the global word line are transferred to local word lines through a block switch driven by a block select signal.

The respective local word lines include a resistor element R and a capacitor element C, and parasitic elements RC included in the respective local word lines may differ from each other. Therefore, a time at which a program voltage is applied to a word line for programming is determined based on the word line which is affected most by the parasitic element, that is, the worst word line.

This means that the program voltage is applied according to a program voltage application time for a word line requiring the longest time to reach the program voltage, even when a word line requiring a short time to reach the program voltage is selected.

The program time is one of the factors which determines the performance of the nonvolatile memory apparatuses. Therefore, there is a demand for reducing the program voltage application time.

SUMMARY

In one embodiment of the present invention, a nonvolatile memory apparatus includes: a memory cell area including a plurality of memory cells connected to a word line and a bit line; a program time controller configured to determine a program voltage application time for a selected word line, as the selected word line is selected in response to a program command and an address signal; and a controller configured to apply a program voltage to the selected word line according to the program voltage application time determined by the program time controller.

In another embodiment of the present invention, a program method of a nonvolatile memory apparatus includes the steps of: applying a program voltage to a selected word line, as the selected word line is selected in response to a program command and an address signal; and applying the program voltage during a predetermined estimated time, when the level of the selected word line rises to a first voltage.

In another embodiment of the present invention, a data processing system includes: a host; and a nonvolatile memory apparatus connected to the host through a host interface, wherein the nonvolatile memory apparatus determines a program voltage application time for a selected word line, as the selected word line is selected in response to a program command and an address signal, and applies a program voltage to the selected word line according to the determined program voltage application time.

BRIEF DESCRIPTION OF THE DRAWINGS

Features, aspects, and embodiments are described in conjunction with the attached drawings, in which.

DETAILED DESCRIPTION

Hereinafter, a nonvolatile memory apparatus, a program method thereof, and a data processing system using the same according to the present invention will be described below with reference to the accompanying drawings through various embodiments.

The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
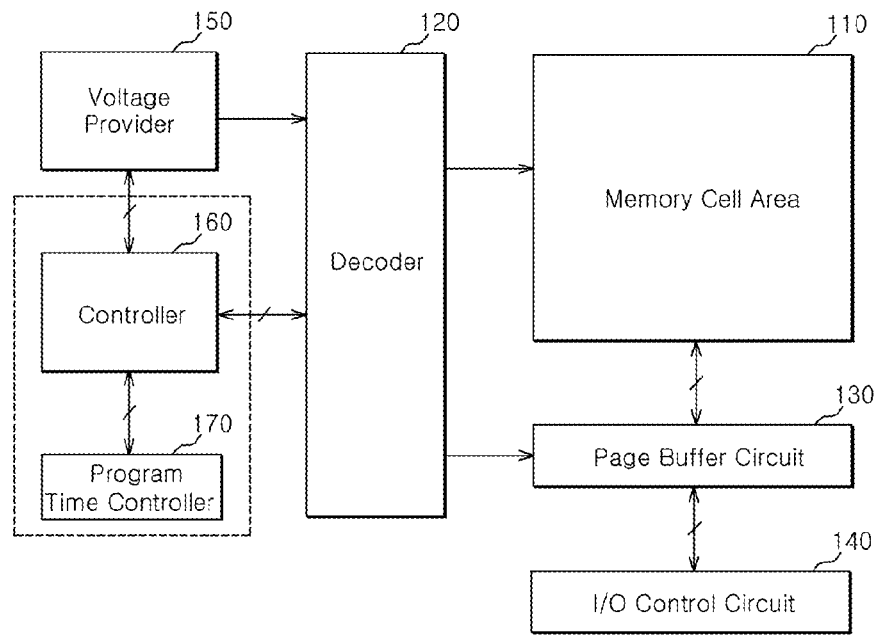
FIG. 1 is a configuration diagram of an example of a nonvolatile memory apparatus according to one embodiment of the present invention.

FIG. 1 is a configuration diagram of a nonvolatile memory apparatus according to one embodiment of the present invention.

Referring to FIG. 1, the nonvolatile memory apparatus 10 according to the embodiment of the present invention may include a memory cell area 110, a decoder 120, a page buffer circuit 130, an I/O control circuit 140, a voltage provider 150, a controller 160, and a program time controller 170.

FIG. 1 illustrates that the controller 160 and the program time controller 170 may be separately provided. However, the nonvolatile memory apparatus may be designed in such a manner that the program time controller 170 is located inside or coupled with the controller 160.

The memory cell area 110 may include one or more planes each having one or more banks. For example, the memory cell area 110 may be configured using flash memory cells. Furthermore, each of the memory cells may be connected between a word line and a bit line.

The decoder 120 may include a block decoder, a block switch, a row decoder, and a column decoder, and may be configured to receive an address signal provided from the controller 160 and select a word line and a bit line of the memory cell area 110.

The page buffer circuit 130 may be connected to a bit line extended from the memory cell region 110. Furthermore, the page buffer circuit 130 may operate according to a column address decoding result of the decoder 120, and may transmit and receive data to and from the I/O control circuit 140.

The voltage provider 150 may include one or more pumps to provide a high voltage for each operation mode of the semiconductor memory apparatus 10. Furthermore, the high voltage generated by the voltage provider 150 may be applied to a selected block of the memory cell area 110 through the decoder 120.

The controller 160 may receive an external control signal, a command signal, and external address signals and it may generate an internal command signal corresponding to the command signal. Furthermore, the controller 160 may generate an internal address based on the external address signals and it may provide the generated internal address to the decoder 120.

The program time controller 170 may determine a program voltage application time for a specific word line, as the specific word line may be selected according to a program command, and it may provide the determined program voltage application time to the controller 160.

The program time controller 170 may estimate the time required for each word line to reach the program voltage Vpgm during a test mode, and it may manage the estimated time with a reference table. Furthermore, when an address signal and a program command are applied from the outside, a program voltage application time (estimated time) for the selected word line may be acquired from the reference table. The acquired program voltage application time may be provided to the controller 160. Accordingly, the controller 160 may apply the program voltage during the corresponding time.

Figure 2:
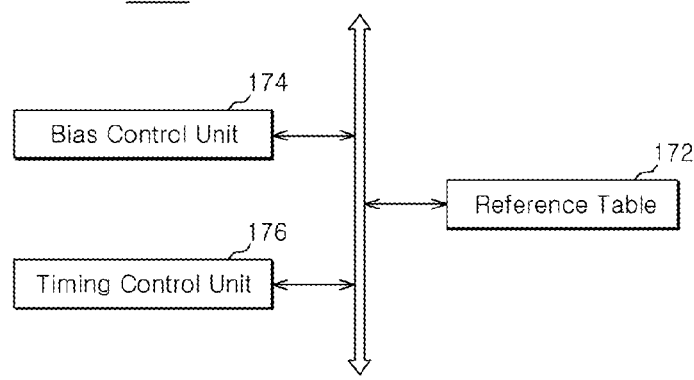
FIG. 2 is a configuration diagram of an example of a program time controller illustrated in FIG. 1.

FIG. 2 is a configuration diagram of the program time controller illustrated in FIG. 1.

Referring to FIG. 2, the program time controller 170 may include a reference table 172, a bias control unit 174, and a timing control unit 176.

The reference table 172 may store an estimated time $\Delta t$ which may be required until each word line reaches the program voltage Vpgm from the pass voltage Vpass. The estimated time $\Delta t$ may be calculated through a test mode, and will be described below.

The bias control unit 174 may check whether or not the voltage of a word line selected for programming has reached the pass voltage Vpass. When the voltage of the selected word line has reached the pass voltage Vpass, the bias control unit 174 may inform the controller 160 that the voltage of the selected word line has reached the pass voltage Vpass.

As a check result, when the voltage of the selected word line reaches the pass voltage Vpass, the timing control unit 176 may acquire an estimated time $\Delta t$ set for the corresponding word line from the reference table 172, and may provide the estimated time $\Delta t$ to the controller 160.

Accordingly, the controller 160 may apply the program voltage Vpgm during the estimated time $\Delta t$ provided from the program time controller 170 after the voltage level of the selected word line reaches the pass voltage Vpass.

Figures 3, 4:
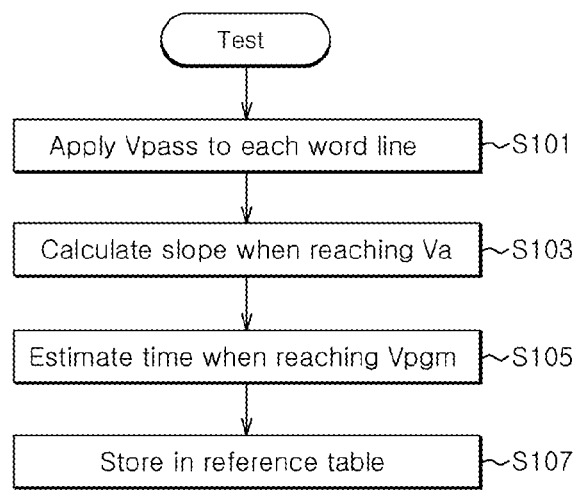
FIG. 3 is an example of a reference table which is applied to an embodiment of the present invention.
FIG. 4 is a flow chart illustrating a process for determining a program voltage application time according to an embodiment of the present invention.

FIG. 3 is an example of the reference table which is applied to the embodiment of the present invention.

When the memory cell area 110 includes a plurality of word lines WL<0:m>, (i.e., word line zero to word line m, m being any positive natural number) the reference table 172 (see FIG. 2) may include a slope ak which may be measured when a k-th word line WL<k> (0≤k≤m, k is a natural number) reaches a first voltage level Va, and an estimated time $\Delta t\_k$ which may be required until the k-th word line WL<k> reaches the program voltage Vpgm after reaching the pass voltage Vpass.

The slope ak, which may be measured when the k-th word line WL<k> reaches the first voltage level Va (desirably, Va<Vpass), may contain an increase in the phase of the voltage level of the corresponding word line. Therefore, by measuring the slope ak when the k-th word line WL<k> reaches the first voltage level Va, it may be possible to predict a slope (offset) until the corresponding word line reaches the program voltage Vpgm from the pass voltage Vpass. Then, the estimated time $\Delta t$ may be calculated from the slope, thereby configuring the reference table 172 and so forth (i.e., . . . ).

Figure 5:
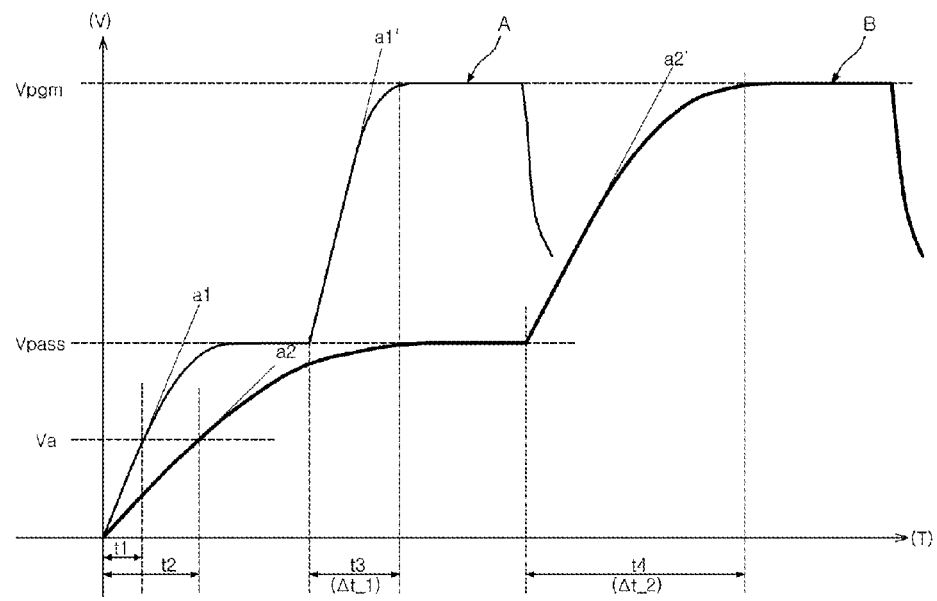
FIG. 5 is a graph illustrating the process for determining a program voltage application time according to an embodiment of the present invention.

FIG. 4 is a flow chart illustrating a process for determining a program voltage application time according to an embodiment of the present invention. FIG. 5 is a graph illustrating the process for determining a program voltage application time according to an embodiment of the present invention.

First, for example, suppose that A of FIG. 5 indicates an increase phase of voltage level when the program voltage is applied to a word line WL<1> and B of FIG. 5 indicates an increase phase of voltage level when the program voltage is applied to a word line WL<2>.

During a test mode, the pass voltage Vpass may be applied to word lines which are sequentially selected, at step S101. When a corresponding word line reaches the first voltage level Va, a slope ak at this time may be calculated at step S103.

Referring to FIG. 5 (where the V axis is for voltage and the T axis is for time), when the word line <1> reaches the first voltage level Va after the pass voltage Vpass is applied to the word line WL<1>, a slope a1 at this time may be calculated by Va/t1. Similarly, when the word line WL<2> reaches the first voltage level Va, a slope a2 at this time may be calculated by Va/t2.

The increase phase of the voltage level until each word line reaches the first voltage level Va may contain an increase phase of voltage level until the corresponding word line reaches the program voltage Vpgm from the pass voltage Vpass.

That is, a slope a1' indicating an increase phase of voltage level until the word line WL<1> reaches the program voltage Vpgm from the pass voltage Vpass may be estimated from the slope a1, and a slope a2' indicating an increase phase of voltage level until the word line WL<2> reaches the program voltage Vpgm from the pass voltage Vpass may be estimated from the slope a2.

Therefore, a time Δt_1 (i.e., t3) required until the voltage level of the word line WL<1> reaches the program voltage Vpgm from the pass voltage Vpass is [(Vpgm−Vpass)/a1']. Since the slope a1' may be estimated from the slope a1, the time Δt_1 may be determined by [(Vpgm−Vpass)/(a1+offset)]. Similarly, an estimated time Δt_2 (i.e., t4) for the word line WL<2> may be determined by [(Vpgm−Vpass)/(a2+offset)].

When the estimated time for each word line is determined at step S105, the estimated time is used to generate and store a reference table at step S107.

Figure 6:
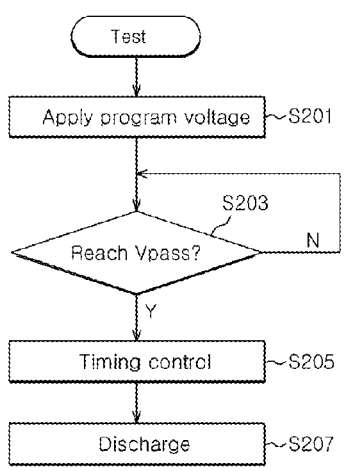
FIG. 6 is a flow chart illustrating a program method according to another embodiment of the present invention.

FIG. 6 is a flow chart illustrating a program method according to another embodiment of the present invention.

Under the assumption that a reference table was generated as described with reference to FIGS. 4 and 5, the program method will be described as follows.

When a specific word line is selected as a program command and an address signal is provided, the program voltage Vpgm may be applied to the selected word line at step S201.

The bias control unit 174 of the program time controller 170 may check whether or not (i.e. Y for yes and N for no) the voltage level of the selected word line has reached the pass voltage Vpass, at step S203. When it is checked and determined that the voltage level of the selected word line has reached the pass voltage Vpass, the bias control unit 174 may then inform the controller 160 of this.

Meanwhile, when checking whether the voltage level of the selected word line has reached the pass voltage Vpass, the timing control unit 176 may acquire an estimated time Δt of the corresponding word line from the reference table 172, and may provide the estimated time Δt to the controller 160. Accordingly, the controller 160 may apply the program voltage Vpgm during the estimated time Δt provided by the timing control unit 176, after the voltage of the selected word line has reached the pass voltage Vpass, at step S205.

Furthermore, after the passing of the provided estimated time Δt, the word line and the bit line may be discharged to complete the program operation at step S207.

Figure 7:
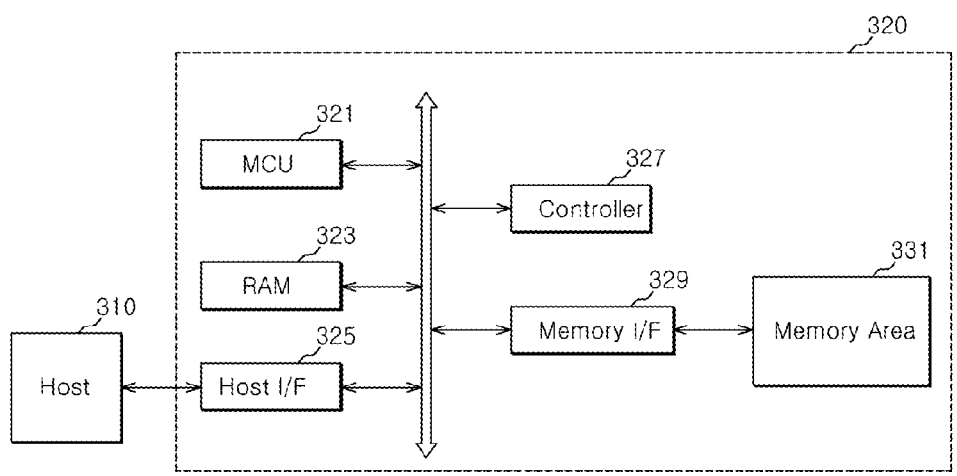
FIG. 7 is an example of a configuration of a data processing system according to another embodiment of the present invention.

FIG. 7 is an example of a configuration of a data processing system according to another embodiment of the present invention.

Referring to FIG. 7, the data processing system 30 according to an embodiment of the present invention may include a host 310 and a nonvolatile memory apparatus 320. Furthermore, the nonvolatile memory apparatus 320 may include a micro controller unit (MCU) 321, a working memory (RAM) 323, a host interface 325, a controller 327, a memory interface 329 (i.e., Memory I/F), and a memory area 331.

The MCU 321 may control the overall operations of the nonvolatile memory apparatus 320, and the firmware or applications for the MCU 321 may be loaded into the RAM 323 and then driven.

The RAM 323 may temporarily store data required for operating the MCU 321. According to the control of the MCU 321, the RAM 323 may temporarily store data of the memory area 331 and then provide the stored data to the host 310 or may temporarily store data of the host 310 and then provide the stored data to the memory area 331.

The host interface 325 may control the data exchange between the host 310 and the memory area 331, and provide a protocol conversion function, if necessary.

The controller 327 may be connected to the memory area 331 through the memory interface 329 to provide commands, addresses, and control signals for controlling the operation of the memory area 331.

In particular, the controller 327 according to the embodiment of the present invention may determine a program voltage application time for a specific word line, as the specific word line may be selected in response to a program command and an address signal, and then apply the program voltage during the determined time. In the embodiment of the present invention, the controller 327 may be configured to include the controller 160 and the program time controller 170, which are illustrated in FIG. 1, or may be designed in such a manner that the program time controller 170 is positioned outside the controller 327.

The controller 327 may estimate the time required for each word line to reach the program voltage Vpgm during a test mode, and may manage the estimated time in a reference table. Furthermore, when an address signal and a program command are applied from the outside, a program voltage application time (estimated time) for a selected word line may be acquired from the reference table. Furthermore, the program voltage may be applied according to the acquired program voltage application time.

The controller 327 for controlling the program time may be configured as described with reference to FIGS. 2 to 6, and thus, for convenience, the detailed descriptions thereof are omitted herein.

Meanwhile, memory cell arrays forming the memory area 331 may include nonvolatile memory cells, and may be configured to have one or more planes each including a plurality of banks or one or more chips.

The configuration of the nonvolatile memory apparatus 320 may not be limited thereto, but devices or components may be added according to the environment of a system to be applied. For example, the nonvolatile memory apparatus 320 may further include a ROM for storing data required for an initial booting operation, an error correction unit, a power supply unit, a communication module and the like.

The nonvolatile memory apparatus 320 may be package as a memory card. Furthermore, the data processing system 30 may further include separate application chipsets, such as a camera module, other than the host 310.

While certain embodiments have been described above, it will be understood to those skilled in the art that the embodiments described are by way of example only. Accordingly, the nonvolatile memory apparatus described herein should not be limited based on the described embodiments. Rather, the nonvolatile memory apparatus described herein should only be limited in light of the claims that follow when taken in conjunction with the above description and accompanying drawings.

What is claimed is:

1. A nonvolatile memory apparatus comprising:
    a memory cell area comprising a plurality of memory cells connected to a word line and a bit line;
    a program time controller configured to dynamically determine a program voltage application time for a selected word line, as the selected word line is selected in response to a program command and an address signal; and
    a controller coupled to the program time controller, and configured to apply a program voltage to the selected word line according to the program voltage application time determined by the program time controller.

2. The nonvolatile memory apparatus according to claim 1, wherein the program time controller estimates a time required for each selected word line to reach the program voltage in response to a test mode signal, manages the estimated time in a reference table, and provides the estimated time for the selected word line to the controller in response to the program command and the address signal.

3. The nonvolatile memory apparatus according to claim 1, wherein the program time controller comprises:
   a reference table configured to store an estimated time which is required until the voltage level of each selected word line reaches the program voltage from a first voltage;
   a bias control unit configured to inform the controller that the voltage level of the selected word line reaches the first voltage, when the voltage level of the selected word line reaches the first voltage; and
   a timing control unit configured to acquire the estimated time of the selected word line and provide the estimated time to the controller.

4. The nonvolatile memory apparatus according to claim 3, wherein, when the voltage level of the selected word line reaches the first voltage, the controller supplies the program voltage during the estimated time provided by the timing control unit.

5. The nonvolatile memory apparatus according to claim 3, wherein the estimated time is estimated from a slope which is measured from a time-voltage relationship when each selected word line receives the first voltage and reaches a second voltage level during a test mode.

6. The nonvolatile memory apparatus according to claim 5, wherein the second voltage level is higher than the first voltage.

7. The nonvolatile memory apparatus according to claim 5, wherein the estimated time comprises an estimated time which is required until the voltage level of each selected word line reaches the program voltage after reaching the first voltage.

8. The nonvolatile memory apparatus according to claim 3, wherein the first voltage comprises a pass voltage.

* * * * *